United States Patent
Agarwal et al.

(10) Patent No.: US 12,512,371 B2
(45) Date of Patent: Dec. 30, 2025

(54) WAFER-LEVEL TESTING OF FANOUT CHIPLETS

(71) Applicant: ADVANCED MICRO DEVICES, INC., Santa Clara, CA (US)

(72) Inventors: Rahul Agarwal, Santa Clara, CA (US); Dean Gonzales, Fort Collins, CO (US)

(73) Assignee: ADVANCED MICRO DEVICES, INC., Santa Clara, CA (US)

( * ) Notice: Subject to any disclaimer, the term of this patent is extended or adjusted under 35 U.S.C. 154(b) by 711 days.

(21) Appl. No.: 17/360,834

(22) Filed: Jun. 28, 2021

(65) Prior Publication Data

US 2022/0415723 A1     Dec. 29, 2022

(51) Int. Cl.
*H01L 21/66* (2006.01)
*H01L 21/48* (2006.01)
*H01L 23/498* (2006.01)

(52) U.S. Cl.
CPC .......... *H01L 22/30* (2013.01); *H01L 21/4857* (2013.01); *H01L 23/49822* (2013.01)

(58) Field of Classification Search
None
See application file for complete search history.

(56) References Cited

U.S. PATENT DOCUMENTS

| | | | |
|---|---|---|---|
| 10,361,173 B2* | 7/2019 | Lin | H01L 25/18 |
| 2011/0316572 A1* | 12/2011 | Rahman | G01R 31/2853 |
| | | | 257/E23.141 |
| 2014/0264331 A1* | 9/2014 | Yao | H01L 22/32 |
| | | | 438/15 |
| 2019/0172818 A1* | 6/2019 | Lin | H01L 21/02354 |
| 2019/0326257 A1* | 10/2019 | Agarwal | H01L 23/3128 |
| 2022/0344225 A1* | 10/2022 | Hsieh | H01L 23/49822 |

OTHER PUBLICATIONS

Charles et al, EP 0577333, Temporary Connections for Fast Electrical Access to Electronic Devices, Jan. 5, 1994. (Year: 1994).*

* cited by examiner

*Primary Examiner* — Alexander G Ghyka (57) ABSTRACT

A chip for wafer-level testing of fanout chiplet, including: a die; a carrier substrate; a plurality of redistribution layers applied to the carrier substrate; and one or more first conductive pathways in the plurality of redistribution layers, wherein the one or more first conductive pathways each comprise a first end coupled to a corresponding input/output connection point of the die and a second end coupled to a corresponding probing site, wherein the one or more first conductive pathways are not routed through the carrier substrate.

20 Claims, 6 Drawing Sheets

WAFER-LEVEL TESTING OF FANOUT CHIPLETS

BACKGROUND

Dies such as chiplets are tested by applying a testing probe to a probing site coupled to an input/output (I/O) connection point of the die. Typically, the conductive pathways between the probing site and the I/O connection point of the die are routed from the die through a substrate to which the probing sites are attached. This consumes space within the substrate, making such routing resources unavailable for routing other components or signals.

DETAILED DESCRIPTION

In some embodiments, a chip for testing fanout chiplets includes: a die; a carrier substrate; a plurality of redistribution layers applied to the carrier substrate; and one or more first conductive pathways in the plurality of redistribution layers, wherein the one or more first conductive pathways each comprise a first end coupled to a corresponding input/output connection point of the die and a second end coupled to a corresponding probing site, wherein the one or more first conductive pathways are not routed through the carrier substrate.

In some embodiments, the first end and second end of each of the one or more first conductive pathways are routed through a same upper-most redistribution layer opposing the carrier substrate. In some embodiments, the chip further includes a metallization layer applied to the plurality of redistribution layers. In some embodiments, wherein the corresponding input/output connection point includes a general purpose input/output (GPIO) connection point. In some embodiments, the corresponding input/output connection point includes a designed for test input/output (DFTIO) connection point. In some embodiments, the corresponding probing site includes a conductive micropad. In some embodiments, the corresponding probing site includes a conductive microbump. In some embodiments, the chip further includes: another die; and one or more second conductive pathways in the plurality of redistribution layers coupling the die to the other die.

In some embodiments, a method for fabricating a chip for testing fanout chiplets includes: applying, to a carrier substrate, a plurality of redistribution layers including one or more first conductive pathways not routed through the carrier substrate; coupling, to a first end of each of the one or more first conductive pathways, a corresponding input/output connection point of a die; and coupling, to a second end of each of the one or more first conductive pathways, a corresponding probing site.

In some embodiments, the first end and second end of each of the one or more first conductive pathways are routed through a same upper-most redistribution layer opposing the carrier substrate. In some embodiments, the method further includes coupling one or more other input/output connection points of the die to another die via one or more second conductive pathways. In some embodiments, the corresponding input/output connection point includes a general purpose input/output (GPIO) connection point. In some embodiments, the corresponding input/output connection point includes a designed for test input/output (DFTIO) connection point. In some embodiments, the corresponding probing site includes a conductive micropad. In some embodiments, the corresponding probing site includes a conductive microbump.

In some embodiments, an apparatus for testing fanout chiplets includes: a chip including: a die; a carrier substrate; a plurality of redistribution layers applied to the carrier substrate; and one or more first conductive pathways in the plurality of redistribution layers, wherein the one or more first conductive pathways each comprise a first end coupled to a corresponding input/output connection point of the die and a second end coupled to a corresponding probing site, wherein the one or more first conductive pathways are not routed through the carrier substrate.

In some embodiments, the first end and second end of each of the one or more first conductive pathways are routed through a same upper-most redistribution layer opposing the carrier substrate. In some embodiments, the chip further includes a metallization layer applied to the plurality of redistribution layers. In some embodiments, the corresponding input/output connection point includes a general purpose input/output (GPIO) connection point. In some embodiments, the corresponding input/output connection point comprises a designed for test input/output (DFTIO) connection point.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. Further, spatially relative terms, such as "beneath," "below," "lower," "above," "upper," "back," "front," "top," "bottom," and the like, are used herein for ease of description to describe one element or feature's relationship to another element(s) or feature(s) as illustrated in the figures. Similarly, terms such as "front surface" and "back surface" or "top surface" and "back surface" may be used herein to more easily identify various components, and may identify that those components are, for example, on opposing sides of another component. The spatially relative terms are intended to encompass different orientations of the device in use or operation in addition to the orientation depicted in the figures.

The construction of a semiconductor device such as a system-in-package (SiP) or system-on-integrated chip (SoIC) generally includes a die fabrication process and a packaging process. The fabrication process, typically performed in a clean room at a foundry, includes fabricating system-on-a-chip (SoC) dies that implement a component, or functional circuit block, of the system on a wafer. For example, each SoC die includes a component such as a processor core, interface, memory, graphical processing unit, digital signal processor, and the like. These components are partitioned on the wafer. During the fabrication process, the device layers implementing the functional circuit blocks and the redistribution structures connecting those functional circuit blocks are created in a clean room with great precision. The wafer is then diced to create individual SoC dies (e.g., "chiplets").

A given die includes various input/output (I/Os) connections. The I/O connections are probed to determine whether the die is functioning correctly. For example, an electronic probe is applied to a signal pathway to a given I/O connection and the die is monitored to ensure that it is functioning as expected in response to the electronic probe. To do so, conductive pathways to the I/O connections must be formed and an endpoint of the conductive pathway made accessible for probing.

Existing solutions require that a conductive pathway from an I/O connection of the die be routed through an substrate to which the die is mounted. For example, the conductive pathways are routed from a die through the substrate to a land grid array (LGA) or ball grid array (BGA) on the opposing side of the substrate. This allows the die to be tested at the package level. However, routing the conductive pathway through the substrate consumes space on the substrate that could be used for routing other pathways. In other words, routing the conductive pathways used for testing consumes valuable routing resources on the substrate.

Figure 1:
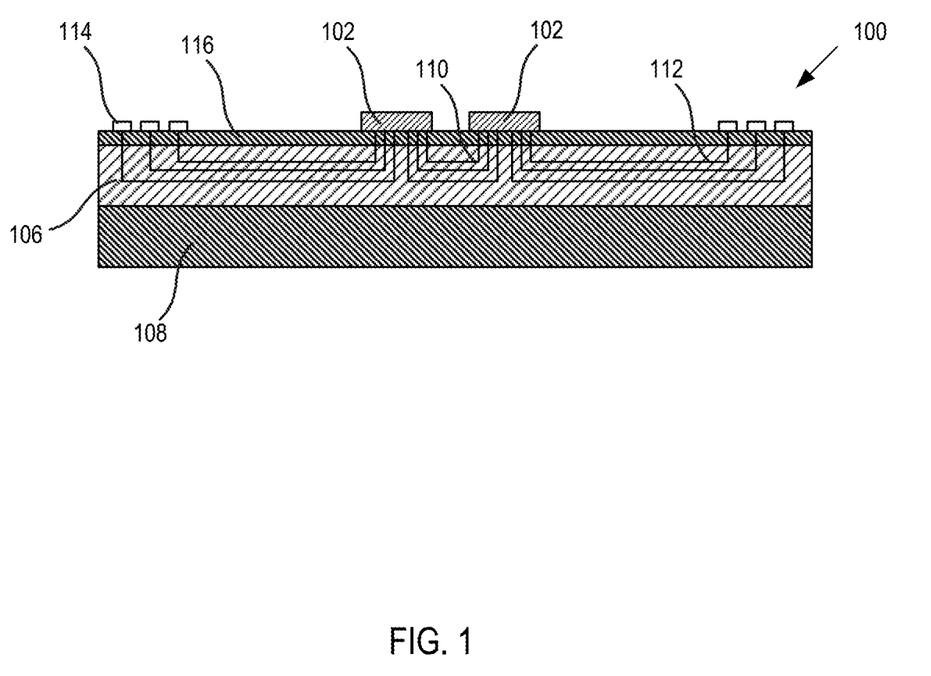
FIG. 1 is a diagram of an example chip for wafer-level testing of fanout chiplets according to some embodiments.

To address these concerns, FIG. 1 shows a diagram of an example chip 100 for wafer-level testing of fanout chiplets according to various embodiments of the present disclosure. Particularly, FIG. 1 shows a cross-sectional view of the example chip 100. The chip 100 of FIG. 1 can be implemented in a variety of devices or apparatuses, including mobile devices, personal computers, peripheral hardware components, gaming devices, set-top boxes, and the like, or any other computing device as can be appreciated. The chip 100 includes dies 102. The dies 102 are composed of a bulk suitable material (e.g., silicon, germanium, or gallium derivatives) and device layers typically fabricated by sequentially depositing insulating or dielectric layers, conductive layers, and semiconductive layers of material over the semiconductor bulk, and patterning the various material layers using photolithography and photomasking to form circuit components and elements (e.g., transistors, capacitors, resistors, etc.). In some embodiments, the circuit components are connected to form integrated circuits that implement a functional circuit block of a SoC die, such as a processor, interface, memory, and or other system component.

The surface of the dies 102 include multiple input/output (I/O) connection points allowing for signals to travel to and from the dies 102, thereby allowing the dies 102 to communicate with other components as desired. In some embodiments, the I/O connection points include design for test I/O (DFTIO) connection points. The DFTIO connection points are I/O connection points dedicated to receiving test signals or probes to determine whether a given die 102 is functioning correctly. In some embodiments, the I/O connection points include general purpose I/O (GPIO) connection points suitable for sending or receiving signals during the functional operation of the die 102.

The chip 100 also includes multiple redistribution layers 106 deposited on a substrate 108. The substrate 108 is a carrier substrate 108 that provides mechanical support to the chip 100 structure. Although the redistribution layers 106 are represented by a continuous blocks of hatching for clarity, it is understood that the redistribution layers 106 as shown represent multiple layers deposited on top of each other on the substrate 108. In some embodiments, the redistribution layers 106 are composed of an organic material such as polyamide. In some embodiments, the substrate 108 includes a circuit board.

A redistribution layer generally is an extra metal layer on a chip 100 that makes the I/O connection points of an integrated circuit (e.g., the dies 102) available in other locations of the chip 100. Redistribution layers 106 are also used to house connections between the I/O connections of a die 102. For example, in the example chip 100, the redistribution layers 106 house conductive pathways 110 of conductive material (e.g., copper) to interconnect various I/O connection of the dies 102. As another example, in the example chip 100, the redistribution layers 106 house conductive pathways 112 to connect I/O connections of a given die 102 to a probing site 114 to be described in further detail below. In some embodiments, the conductive pathways 110,112 are placed or housed within the redistribution layers 106 in a fan out configuration.

The conductive pathways 110,112 are paths of conductive material such as copper, gold, and the like formed in redistribution layers 106 that are suitable for carrying power or signals to the I/O connection points of a die 102. The conductive pathways 110,112 include traces of conductive material to form a portion of the conductive pathway 110, 112 within a same redistribution layer 106. The conductive pathways 110,112 also include conductive pads, vias, or combinations thereof that provide a path between redistribution layers 106 (e.g., to an adjacent higher or lower redistribution layer 106. As an example, a conductive pathway 110 from a first die 102 to a second die 102 will include one or more conductive pads or vias from the first die 102 to a conductive trace in a particular redistribution layer 106 and one or more conductive pads or vias from the conductive trace to the second die 102.

The example chip 100 also includes a metallization layer 116 deposited on the surface of the redistribution layers 106. The metallization layer 116 is a layer of a conductive material such as copper, gold, or another conductive metal. The metallization layer 116 provides a conductive surface to which conductive material such as solder can be applied. For example, the metallization layer 116 provides a surface to which solder can be applied for conductively coupling probing sites 114 to conductive pathways 112. As another example, the metallization layer 116 provides a conductive surface for depositing solder to form a connection to the I/O connection points of a die 102.

The probing sites 114 are portions of conductive materials that provide a surface for contact by an electronic probe. Thus, a probe contacting a given probing site 114 provides power or a signal to a given die 102 conductively coupled to the probing site 114 via a conductive pathway 112. In some embodiments the probing sites 114 are deposits of solder (e.g., microbumps). In some embodiments the probing sites 114 are conductive pads.

The probing sites 114 are located on a same side or surface of the chip as the dies 102. The conductive pathways 112 coupling the probing sites 114 to the dies 102 are not routed through the substrate 108, allowing for routing resources (e.g., routing space) in the substrate 108 to be used for purposes other than die 102 testing. As shown, a first end of a conductive pathway 112 is routed through an upper-most redistribution layer 106 opposing the substrate 108 to a die 102 and a second end of the conductive pathway 112 is routed through an upper-most redistribution layer 106 opposing the substrate 108 to a probing site 114. In addition to saving routing resources, this allows for the dies 102 to be tested on the wafer level via the probing sites 114. This is in contrast to existing solutions where the dies 102 must be tested after packaging using routes and routing resources in a packaging substrate.

Figure 2:
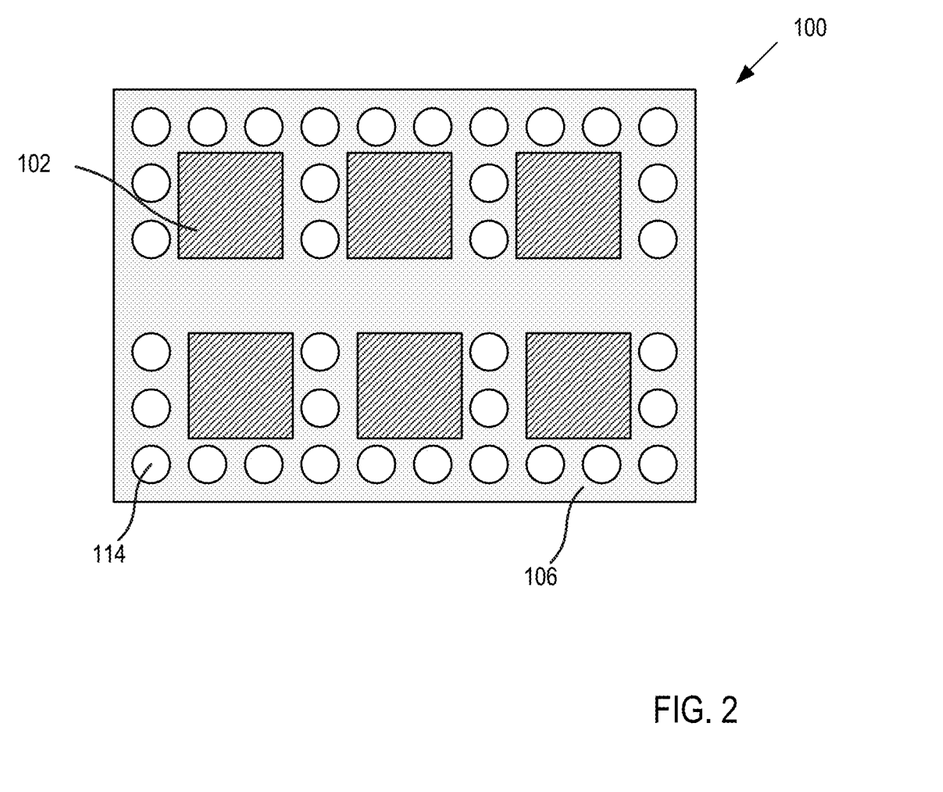
FIG. 2 is a diagram of an example chip for wafer-level testing of fanout chiplets according to some embodiments.

FIG. 2 shows an alternative view of the example chip 100 for wafer-level testing of fanout chiplets according to various embodiments of the present disclosure. Particularly, FIG. 2 shows an overhead view of the example chip 100. As shown in FIG. 2, multiple dies 102 are deposited onto redistribution layers 106. A metallization layer 116 where present is not shown for clarity. Multiple probing sites 114 are also deposited on the chip 100. Each probing site 114 allows for probing of an I/O connection point of a given die 102. Conductive pathways 112 (not shown) that couple each probing site 114 to a given die 102 are housed within the underlying redistribution layers 106. Thus, each die 102 is able to be tested on the wafer level (e.g., without packaging).

One skilled in the art will appreciate that the configurations of the chip 100 are merely exemplary, and that other configurations are also contemplated within the scope of the present disclosure. For example, dies 102 may be added or removed from the chip 100, or arranged in different layouts or configurations. In other words, the scope of the present disclosure extends to any configuration of dies 102 whereby the dies 102 are tested using probing sites 114 coupled by conductive pathways 112 that are not routed through a substrate 108 (e.g., where first and second ends of the conductive pathways 112 are routed through a same upper-most redistribution layer 106.

Figure 3A:
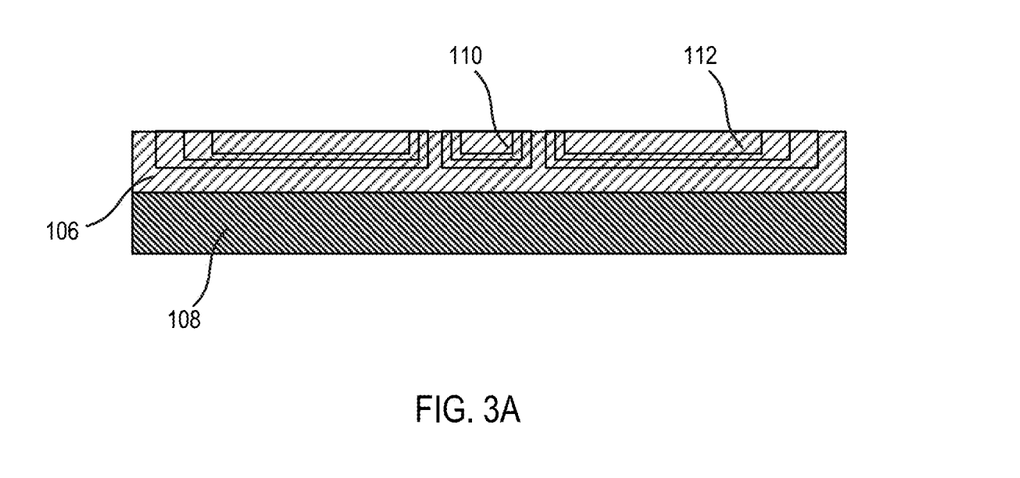
FIG. 3A is a diagram of a portion of an example fabrication process for a chip for wafer-level testing of fanout chiplets according to some embodiments.

FIGS. 3A-3D show a fabrication process for a chip for wafer-level testing of fanout chiplets according to embodiments of the present disclosure. For example, the chip manufactured according to the process depicted in FIGS. 3A-3D is a chip 100 as shown in FIG. 1 or FIG. 2. Beginning with FIG. 3A, multiple redistribution layers 106 are deposited on a substrate 108. The substrate 108 is a carrier substrate 108 that provides mechanical support to the chip 100 structure. For example, the substrate 108 provides mechanical support for applying the redistribution layers 106 as shown in FIG. 3A. In some embodiments, the substrate 108 is composed of a dielectric (e.g., insulating) material.

The redistribution layers 106 are represented by a continuous blocks of hatching for clarity. One skilled in the art will appreciate that the redistribution layers 106 as shown represent multiple layers deposited on top of each other on the substrate 108. In some embodiments, the redistribution layers 106 are composed of an organic material such as polyamide. As particular redistribution layers 106 are deposited (e.g., on the substrate 108 or an underlying redistribution layer 106), portions of conductive pathways 110,112 are housed in the deposited redistribution layer 106.

For example, for some redistribution layers 106, a conductive trace of copper, gold, or another conductive material is housed in the deposited redistribution layer 106. This conductive trace provides a conductive pathway that traverses the deposited redistribution layer 106. As another example, for some redistribution layers 106, a conductive via or conductive pad is housed in the deposited redistribution layer 106. The conductive via or conductive pad is conductively coupled to a conductive trace, via, or pad housed in the underlying redistribution layer 106. Thus, the conductive via or pad forms a portion of a conductive pathway 110,112 that traverses between redistribution layers 106. The conductive pathways 110 form signal or power pathways that interconnect various I/O connection of dies 102. The conductive pathways 112 connect I/O connections of a given die 102 to a probing site 114 to be described in further detail below.

Figure 3B:
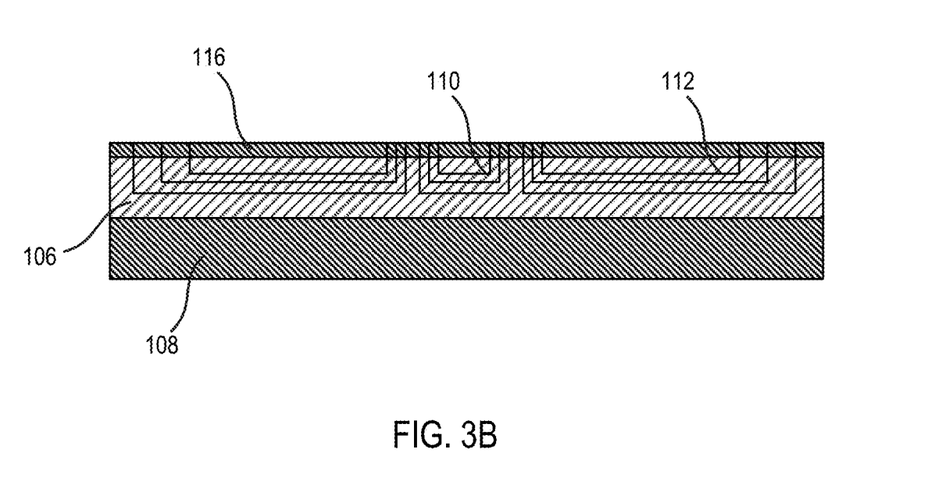
FIG. 3B is a diagram of a portion of an example fabrication process for a chip for wafer-level testing of fanout chiplets according to some embodiments.

Turning next to FIG. 3B, a metallization layer 116 is applied to the upper-most redistribution layer 106 (e.g., the redistribution layer 106 furthest from the substrate 108). The metallization layer 116 is a layer of a conductive material such as copper, gold, or another conductive metal. The metallization layer 116 provides a conductive surface to which conductive material such as solder can be applied. For example, the metallization layer 116 provides a surface to which solder can be applied for conductively coupling probing sites 114 to conductive pathways 112. As another example, the metallization layer 116 provides a conductive surface for depositing solder to form a connection to the I/O connection points of a die 102.

Figure 3C:
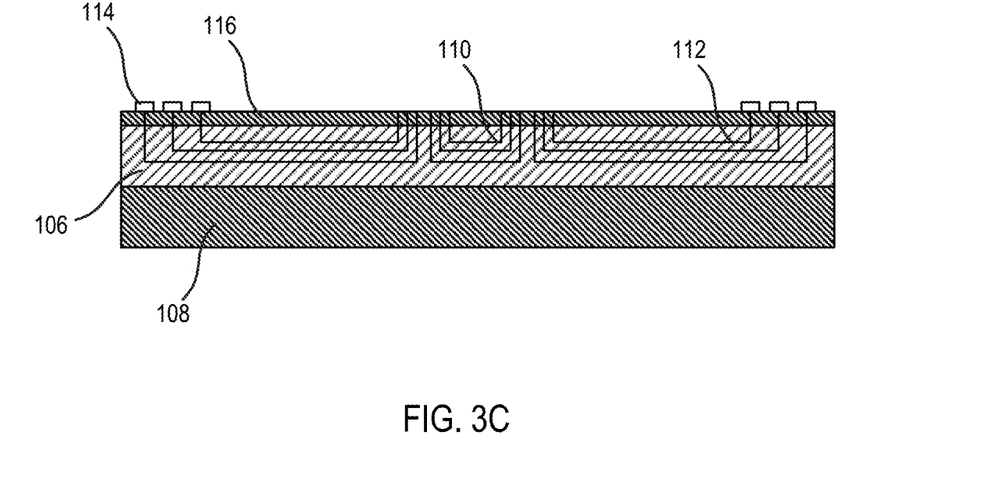
FIG. 3C is a diagram of a portion of an example fabrication process for a chip for wafer-level testing of fanout chiplets according to some embodiments.

Moving to FIG. 3C, probing sites 114 are applied to the metallization layer 116. The probing sites 114 are portions of conductive materials that provide a surface for contact by an electronic probe. Thus, a probe contacting a given probing site 114 provides power or a signal to a given die 102 conductively coupled to the probing site 114 via a conductive pathway 112. In some embodiments the probing sites 114 are deposits of solder (e.g., microbumps). In some embodiments the probing sites 114 are conductive pads. In some embodiments, applying the probing sites 114 includes bonding a conductive micropad to the metallization layer 116 using solder or another conductive bonding compound. In other embodiments, a microbump of solder is applied to the metallization layer 116 to serve as the probing site 114 itself.

Figure 3D:
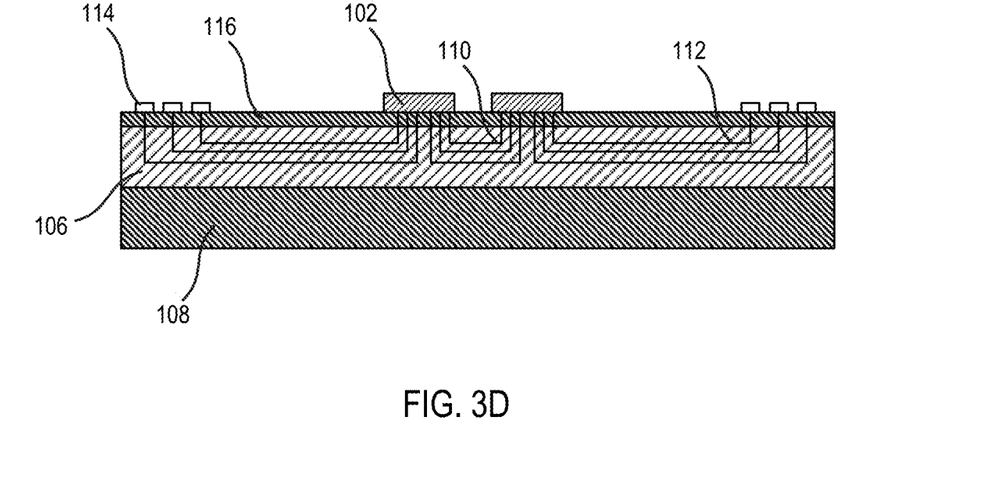
FIG. 3D is a diagram of a portion of an example fabrication process for a chip for wafer-level testing of fanout chiplets according to some embodiments.

Turning next to FIG. 3D, dies 102 are bonded to the conductive pathways 110,112 at the I/O connection points of the dies 102. The dies 102 are composed of a bulk suitable material (e.g., silicon, germanium, or gallium derivatives) and device layers typically fabricated by sequentially depositing insulating or dielectric layers, conductive layers, and semiconductive layers of material over the semiconductor bulk, and patterning the various material layers using photolithography and photomasking to form circuit components and elements (e.g., transistors, capacitors, resistors, etc.). In some embodiments, the circuit components are connected to form integrated circuits that implement a functional circuit block of a SoC die, such as a processor, interface, memory, and or other system component.

The surface of the dies 102 include multiple input/output (I/O) connection points allowing for signals to travel to and from the dies 102, thereby allowing the dies 102 to communicate with other components as desired. In some embodiments, the I/O connection points include design for test I/O (DFTIO) connection points. The DFTIO connection points are I/O connection points dedicated to receiving test signals or probes to determine whether a given die 102 is functioning correctly. In some embodiments, the I/O connection points include general purpose I/O (GPIO) connection points suitable for sending or receiving signals during the functional operation of the die 102.

In some embodiments, bonding a die 102 to the conductive pathways 110,112 includes using solder or another conductive bonding material to form a conductive bond with the conductive pathways 110,112 (e.g., via the metallization layer 116). Thus, the I/O connection points of the dies 102 are bonded to both conductive pathways 110 to other dies 102 and conductive pathways 112 to the probing sites 114 for testing at the wafer level.

One skilled in the art will appreciate that the fabrication process shown in FIGS. 3A-3D is merely exemplary, and that modification or addition of these steps is contemplated within the scope of the present disclosure. For example, additional dies 102, conductive pathways 110,112, or other features added during a fabrication process are within the scope of the present disclosure.

Figure 4:
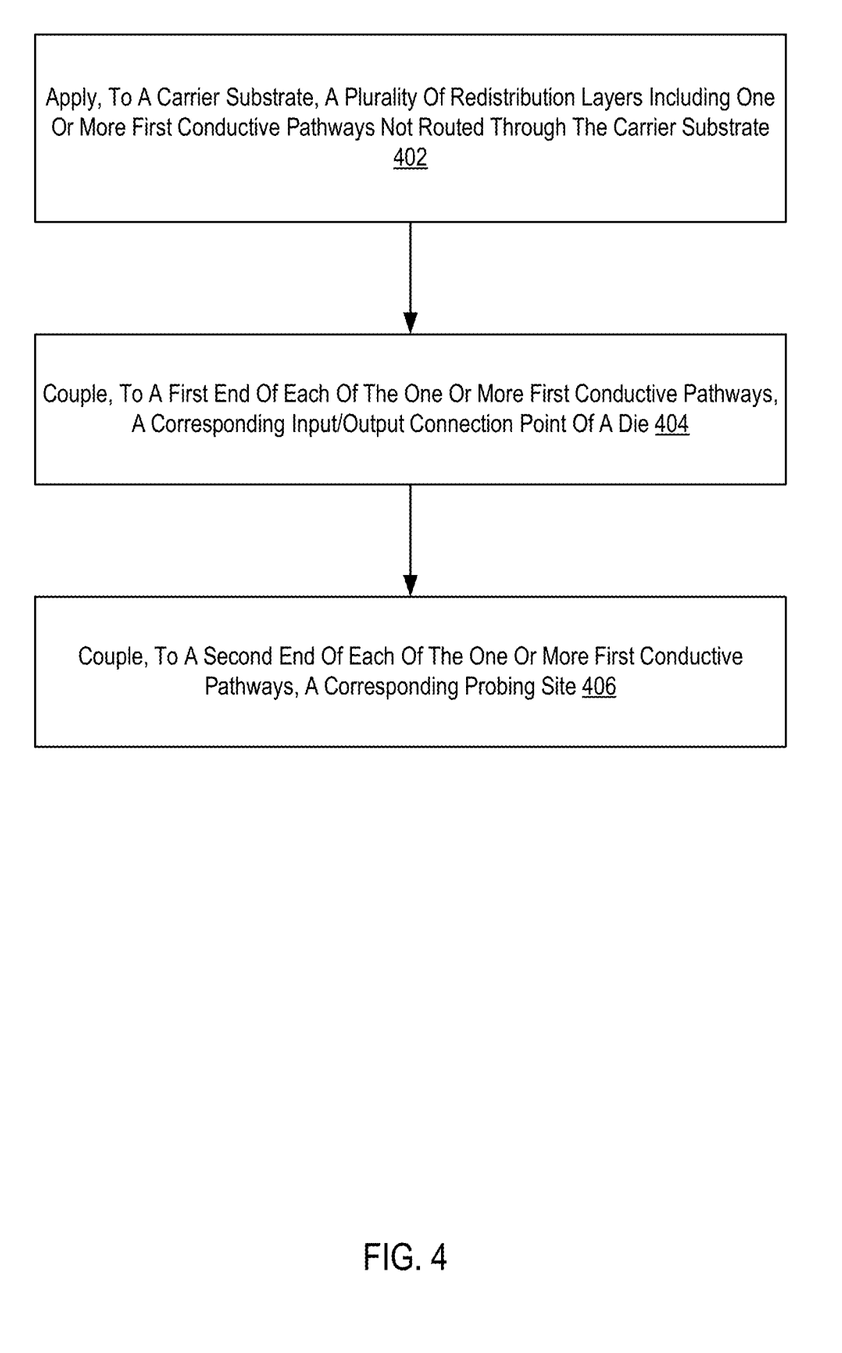
FIG. 4 is a flowchart of an example method for wafer-level testing of fanout chiplets according to some embodiments.

For further explanation, FIG. 4 sets forth a flow chart illustrating an example method for wafer-level testing of fanout chiplets that includes applying 402, to a carrier substrate 108 a plurality of redistribution layers 106 including one or more first conductive pathways 112 not routed through the carrier substrate 108. The carrier substrate 108 provides mechanical support for applying the redistribution layers 106. In some embodiments, the carrier substrate 108 is composed of a dielectric (e.g., insulating) material.

In some embodiments, the redistribution layers 106 are composed of an organic material such as polyamide. As particular redistribution layers 106 are deposited (e.g., on the carrier substrate 108 or an underlying redistribution layer 106), portions of the one or more first conductive pathways 112 are housed in the deposited redistribution layer 106. For example, for some redistribution layers 106, a conductive trace of copper, gold, or another conductive material is housed in the deposited redistribution layer 106. This conductive trace provides a conductive pathway that traverses the deposited redistribution layer 106. As another example, for some redistribution layers 106, a conductive via or conductive pad is housed in the deposited redistribution layer 106. The conductive via or conductive pad is conductively coupled to a conductive trace, via, or pad housed in the underlying redistribution layer 106. Thus, the conductive via or pad forms a portion of a first conductive pathway 112 that traverses between redistribution layers 106. In some embodiments, applying the redistribution layers 106 includes applying a first redistribution layer 106 to the substrate 108 with the necessary conductive traces, pads, or vias. A second redistribution layer 106 is then applied to the first redistribution layer 106 with its necessary conductive traces, pads or vias. Successive redistribution layers 106 are applied to an underlying redistribution layer 106 until the upper-most redistribution layer 106 is applied.

The method of FIG. 4 also includes coupling 404, to a first end of each of the one or more first conductive pathways 112, a corresponding I/O connection point of a die 102. The die 102 is composed of a bulk suitable material (e.g., silicon, germanium, or gallium derivatives) and device layers typically fabricated by sequentially depositing insulating or dielectric layers, conductive layers, and semiconductive layers of material over the semiconductor bulk, and patterning the various material layers using photolithography and photomasking to form circuit components and elements (e.g., transistors, capacitors, resistors, etc.). In some embodiments, the circuit components are connected to form integrated circuits that implement a functional circuit block of a SoC die, such as a processor, interface, memory, and or other system component.

The surface of the die 102 includes multiple input/output (I/O) connection points allowing for signals to travel to and from the die 102, thereby allowing the die 102 to communicate with other components as desired. In some embodiments, the I/O connection points include design for test I/O (DFTIO) connection points. The DFTIO connection points are I/O connection points dedicated to receiving test signals or probes to determine whether a given die 102 is functioning correctly. In some embodiments, the I/O connection points include general purpose I/O (GPIO) connection points suitable for sending or receiving signals during the functional operation of the die 102.

The first end of a given first conductive pathway is routed through an upper-most redistribution layer 106. The upper-most redistribution layer 106 is a redistribution layer 106 furthest from the carrier substrate 108. In some embodiments, the first end of the given conductive pathway 112 is routed through or in conductive contact with a metallization layer 116. In some embodiments, coupling 404 the I/O connection point of a die 102 to the corresponding first end includes applying solder or another conductive bonding material to the first end or a portion of the metallization layer 116 coupled to the first end and coupling the I/O connection point to the solder.

The method of FIG. 4 also includes coupling 406, to a second end of each of the one or more first conductive pathways 112, a corresponding probing site 114. As with the first end, the second end of a given first conductive pathway 112 is routed through an upper-most redistribution layer 106. Thus, the given conductive pathway 112 is routed entirely within the redistribution layers 106 and not routed through the carrier substrate 108.

The probing sites 114 are portions of conductive materials that provide a surface for contact by an electronic probe. Thus, a probe contacting a given probing site 114 provides power or a signal to a given die 102 conductively coupled to the probing site 114 via a first conductive pathway 112. In some embodiments the probing sites 114 are deposits of solder (e.g., microbumps). In some embodiments the probing sites 114 are conductive pads. In some embodiments, applying the probing sites 114 includes bonding a conductive micropad to the metallization layer 116 using solder or another conductive bonding compound. In other embodiments, a microbump of solder is applied to the metallization layer 116 to serve as the probing site 114 itself.

Figure 5:
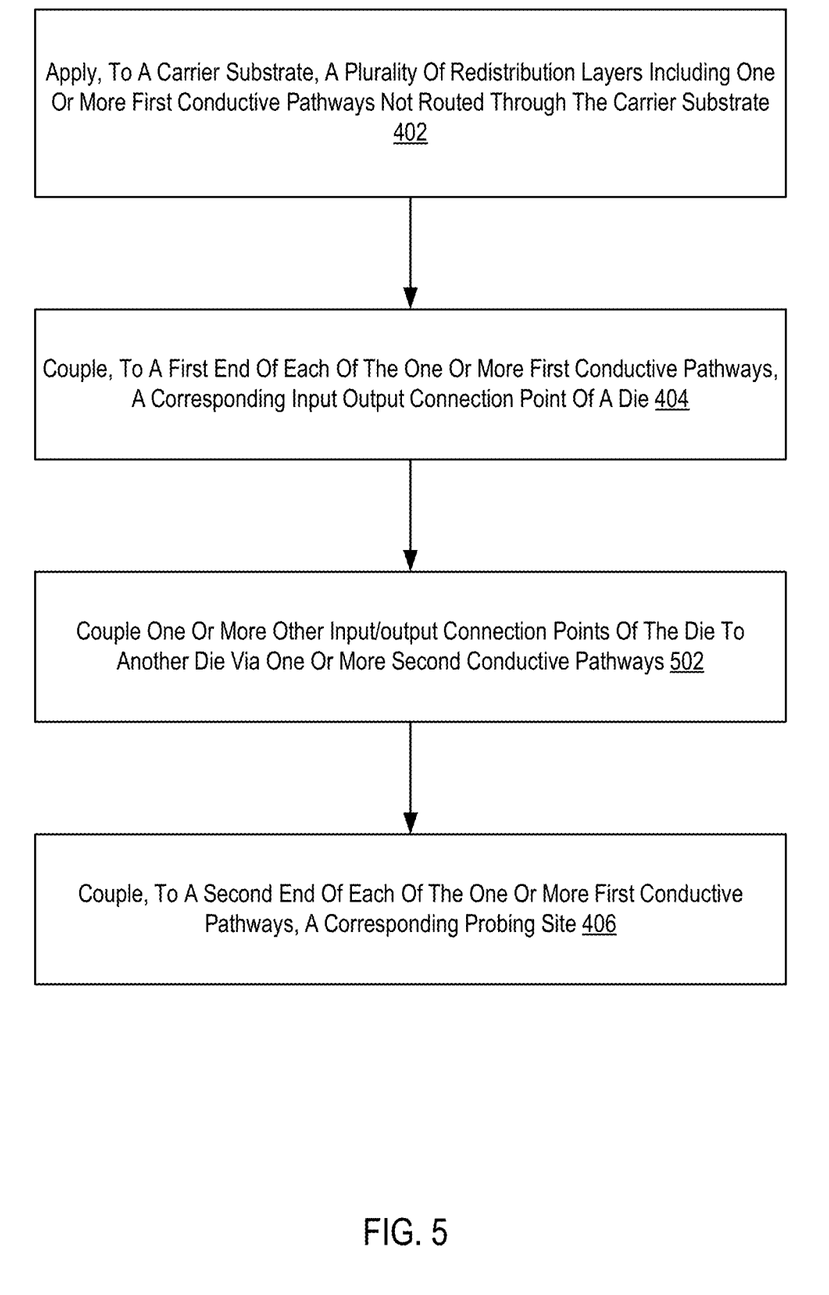
FIG. 5 is a flowchart of another example method for wafer-level testing of fanout chiplets according to some embodiments.

For further explanation, FIG. 5 sets forth a flow chart illustrating another example method for wafer-level testing of fanout chiplets according to embodiments of the present disclosure. The method of FIG. 5 is similar to that of FIG. 4 in that the method of FIG. 5 also includes applying 402, to a carrier substrate 108 a plurality of redistribution layers 106 including one or more first conductive pathways 112 not routed through the carrier substrate 108; coupling 404, to a first end of each of the one or more first conductive pathways 112, a corresponding I/O connection point of a die 102; and coupling 406, to a second end of each of the one or more first conductive pathways 112, a corresponding probing site 114.

The method of FIG. 5 differs from FIG. 4 in that the method of FIG. 5 includes coupling 502 one or more other I/O connection points of the die 102 to another die 102 via one or more second conductive pathways 110. The second conductive pathways 110 are housed in the redistribution layers 106 similar to the first conductive pathways 112 as described above. While the first conductive pathways 112 provide a path from an I/O connection point of a die 102 to a probing site 114, the second conductive pathways 110 are used to interconnect the I/O connection points of dies 102, thereby enabling signal transfer between dies 102.

In view of the explanations set forth above, readers will recognize that the benefits of wafer-level testing of fanout chiplets include:

Improved performance of a computing system by enabling wafer-level testing of a die without using routing resources of a substrate.

Exemplary embodiments of the present disclosure are described largely in the context of a fully functional computer system for wafer-level testing of fanout chiplets. Readers of skill in the art will recognize, however, that the present disclosure also can be embodied in a computer program product disposed upon computer readable storage media for use with any suitable data processing system. Such computer readable storage media can be any storage medium for machine-readable information, including magnetic media, optical media, or other suitable media. Examples of such media include magnetic disks in hard drives or diskettes, compact disks for optical drives, magnetic tape, and others as will occur to those of skill in the art. Persons skilled in the art will immediately recognize that any computer system having suitable programming means will be capable of executing the steps of the method of the disclosure as embodied in a computer program product. Persons skilled in the art will recognize also that, although some of the exemplary embodiments described in this specification are oriented to software installed and executing on computer hardware, nevertheless, alternative embodiments implemented as firmware or as hardware are well within the scope of the present disclosure.

The present disclosure can be a system, a method, and/or a computer program product. The computer program product can include a computer readable storage medium (or media) having computer readable program instructions thereon for causing a processor to carry out aspects of the present disclosure.

The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can include copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present disclosure can be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present disclosure.

Aspects of the present disclosure are described herein with reference to flowchart illustrations and/or block diagrams of methods, apparatus (systems), and computer program products according to embodiments of the disclosure. It will be understood that each block of the flowchart illustrations and/or block diagrams, and combinations of blocks in the flowchart illustrations and/or block diagrams, can be implemented by computer readable program instructions.

These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein includes an article of manufacture including instructions which implement aspects of the function/act specified in the flowchart and/or block diagram block or blocks.

The computer readable program instructions can also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present disclosure. In this regard, each block in the flowchart or block diagrams can represent a module, segment, or portion of instructions, which includes one or more executable instructions for implementing the specified logical function(s). In some alternative implementations, the functions noted in the block can occur out of the order noted in the figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

It will be understood from the foregoing description that modifications and changes can be made in various embodiments of the present disclosure. The descriptions in this specification are for purposes of illustration only and are not to be construed in a limiting sense. The scope of the present disclosure is limited only by the language of the following claims.

What is claimed is:

1. A chip for wafer-level testing of fanout chiplets comprising:
    a die;
    a carrier substrate;
    a plurality of redistribution layers applied to the carrier substrate;
    one or more first conductive pathways in the plurality of redistribution layers, wherein the one or more first conductive pathways each include only two ends including a first end coupled to a corresponding input/output connection point of the die and a second end coupled to a corresponding probing site, wherein the one or more first conductive pathways are not routed through the carrier substrate and are not coupled to another die;
    a second die; and
    one or more second conductive pathways in the plurality of redistribution layers coupling the die to the second die, wherein the one or more second conductive pathways include only two ends including a first end coupled to a corresponding connection point of the die and a second end coupled to a corresponding connection point of the second die.

2. The chip of claim 1, wherein the first end and second end of each of the one or more first conductive pathways are routed through a same upper-most redistribution layer opposing the carrier substrate.

3. The chip of claim 1, further comprising a metallization layer applied to the plurality of redistribution layers, wherein the die and the probing site for each of the one or more first conductive pathways are applied to the metallization layer.

4. The chip of claim 1, wherein the corresponding input/output connection point comprises a general purpose input/output (GPIO) connection point.

5. The chip of claim 1, wherein the corresponding input/output connection point comprises a designed for test input/output (DFTIO) connection point.

6. The chip of claim 1, wherein the corresponding probing site comprises a conductive micropad.

7. The chip of claim 1, wherein the corresponding probing site comprises a conductive microbump.

8. The chip of claim 1,
    wherein the one or more second conductive pathways are not coupled to the one or more first conductive pathways.

9. An apparatus for wafer-level testing of fanout chiplets, the apparatus comprising:
    a system-on-chip; and
    computer memory, wherein the system-on-chip is coupled to the computer memory and comprises a plurality of dies, where each of the dies comprises a functional circuit block, and the system-on-chip comprises:
        a carrier substrate;
        a plurality of redistribution layers applied to the carrier substrate; and
        one or more first conductive pathways in the plurality of redistribution layers, wherein the one or more first conductive pathways each include only two ends including a first end coupled to a corresponding input/output connection point of a first die of the plurality of dies and a second end coupled to a corresponding probing site, wherein the one or more first conductive pathways are not routed through the carrier substrate and are not coupled to another die; and
        one or more second conductive pathways in the plurality of redistribution layers coupling the first die to a second die of the plurality of dies, wherein the one or more second conductive pathways include only two ends including a first end coupled to a corresponding connection point of the first die and a second end coupled to a corresponding connection point of the second die.

10. The apparatus of claim 9, wherein the first end and second end of each of the one or more first conductive pathways are routed through a same upper-most redistribution layer opposing the carrier substrate.

11. The apparatus of claim 9, wherein the system-on-chip further comprises a metallization layer applied to the plurality of redistribution layers, wherein the plurality of dies and the probing site for each of the one or more first conductive pathways are applied to the metallization layer.

12. The apparatus of claim 9, wherein the corresponding input/output connection point comprises a general purpose input/output (GPIO) connection point.

13. The apparatus of claim 9, wherein the corresponding input/output connection point comprises a designed for test input/output (DFTIO) connection point.

14. A chip for wafer-level testing of fanout chiplets comprising:
    a plurality of dies;
    a carrier substrate;
    a plurality of redistribution layers applied to the carrier substrate;
    one or more first conductive pathways in the plurality of redistribution layers coupled to the plurality of dies, wherein the one or more first conductive pathways each include only two ends including a first end coupled to a corresponding input/output connection point of a first die of the plurality of dies and a second end coupled to a corresponding probing site, wherein the one or more first conductive pathways are not routed through the carrier substrate and are not coupled to another die; and one or more second conductive pathways in the plurality of redistribution layers coupling the first die to a second die of the plurality of dies, wherein the one or more second conductive pathways include only two ends including a first end coupled to a corresponding connection point of the first die and a second end coupled to a corresponding connection point of the second die.

15. The chip of claim 14, wherein the first end and second end of each of the one or more first conductive pathways are routed through a same upper-most redistribution layer opposing the carrier substrate.

16. The chip of claim 14, further comprising a metallization layer applied to the plurality of redistribution layers, wherein the plurality of dies and the probing site for each of the one or more first conductive pathways are applied to the metallization layer.

17. The chip of claim 14, wherein the corresponding input/output connection point comprises a general purpose input/output (GPIO) connection point.

18. The chip of claim 14, wherein the corresponding input/output connection point comprises a designed for test input/output (DFTIO) connection point.

19. The chip of claim 14, wherein the corresponding probing site comprises a conductive micropad.

20. The chip of claim 14, wherein the corresponding probing site comprises a conductive microbump.

* * * * *